(12) United States Patent
Lee et al.

(10) Patent No.: US 7,482,276 B2
(45) Date of Patent: Jan. 27, 2009

(54) SEMICONDUCTOR DEVICE AND METHOD OF MANUFACTURING THE SAME

(75) Inventors: Han Choon Lee, Seoul (KR); Kyung Min Park, Incheon (KR); Cheon Man Shim, Seoul (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 70 days.

(21) Appl. No.: 11/613,210

(22) Filed: Dec. 20, 2006

(65) Prior Publication Data

US 2007/0152336 A1 Jul. 5, 2007

(30) Foreign Application Priority Data

Dec. 29, 2005 (KR) .................. 10-2005-0133966

(51) Int. Cl.
*H01L 21/311* (2006.01)
(52) U.S. Cl. ...................................... 438/700; 438/653
(58) Field of Classification Search ................ 257/750, 257/751, 758, 767, 762, 643, 653, 369; 438/643, 438/653, 369
See application file for complete search history.

(56) References Cited

U.S. PATENT DOCUMENTS

| | | | | |
|---|---|---|---|---|
| 5,650,639 A | * | 7/1997 | Schrantz et al. | ............... 257/77 |
| 6,756,321 B2 | * | 6/2004 | Ko et al. | ...................... 438/778 |
| 6,833,625 B1 | * | 12/2004 | Wang et al. | .................. 257/774 |
| 2002/0158337 A1 | * | 10/2002 | Babich et al. | ............... 257/758 |
| 2006/0160372 A1 | * | 7/2006 | Dorfman | ..................... 438/761 |
| 2006/0172530 A1 | * | 8/2006 | Cheng et al. | ................. 438/637 |
| 2007/0228570 A1 | * | 10/2007 | Dimitrakopoulos et al. | . 257/754 |

* cited by examiner

*Primary Examiner*—S. V Clark
(74) *Attorney, Agent, or Firm*—Saliwanchik, Lloyd & Saliwanchik

(57) ABSTRACT

A semiconductor device and method of manufacturing same, capable of preventing the material of a barrier metal layer from penetrating into an intermetallic insulating layer are provided. In an embodiment, the device can include: a first metal interconnection formed in a lower insulating layer on a semiconductor substrate; an intermetallic insulating layer formed on the lower insulating layer including the first metal interconnection, the intermetallic insulating layer having a via hole and a trench for a second metal interconnection connecting to the first metal interconnection; a carbon implantation layer formed on inner walls of the via hole and the trench of the intermetallic insulating layer; a barrier metal layer deposited on the first metal interconnection exposed through the via hole and on the carbon implantation layer; a via formed in the via hole; and the second metal interconnection formed in the trench.

9 Claims, 5 Drawing Sheets

SEMICONDUCTOR DEVICE AND METHOD OF MANUFACTURING THE SAME

RELATED APPLICATION(S)

This application claims priority under 35 U.S.C. §119(e) of Korean Patent Application No. 10-2005-0133966 filed Dec. 29, 2005, which is incorporated herein by reference in its entirety.

FIELD OF THE INVENTION

The present invention relates to a semiconductor device and method of manufacturing the same. More particularly, the present invention relates to a semiconductor device and a method of manufacturing the same, capable of preventing the material of a barrier metal layer from penetrating into an intermetallic insulating layer of a porous low-k material used to reduce capacitance between interconnections.

BACKGROUND OF THE INVENTION

According Moore's law, the integration degree of a semiconductor device such as a transistor doubles every two years. Such an increase of the integration degree in semiconductor chips leads to micro-sized transistors and interconnections.

As the interconnections are fabricated in a micro-size, resistance R and capacitance C between interconnections increase, so that the RC delay time is lengthened. Such an increase of the RC delay time causes degradation of the operating speed and performance of the semiconductor device.

Accordingly the interconnections are metallized using copper, which has a resistance lower than that of aluminum.

Unlike aluminum metallization, copper metallization employs a process called a dual damascene process.

According to the dual damascene process, an insulating layer is formed with a via for connection with a lower conductive layer and a trench for an interconnection region. A barrier metal layer for preventing transfer of copper into the insulating layer is formed on inner walls of the via and the trench. Then, the via and trench are filled with copper.

Further, in order to reduce the capacitance between the interconnections, an interlayer dielectric layer including low-k materials, such as fluorinated silicate glass (FSG, k=3.7) or organosilicate glass (OSG, k=2.8), are used instead of silicon oxide ($SiO_2$, k=4.2).

Furthermore, in order to further reduce the dielectric constant k of the dielectric material of the insulating layer, a porous low-k material is used, which has the dielectric constant (k=1) of vacuum by artificially forming pores in an ordinary low-k material.

However, because the porous low-k material has a lot of pores therein, a barrier metal used in the copper metallization penetrates into the pores. As a result, the dielectric constant of the porous low-k material is increased.

Hereinafter, a conventional method of forming a copper interconnection in a porous low-k thin film will be described with reference to the accompanying drawings.

Referring to FIG. 1A, a lower insulating layer 100 is formed on a semiconductor substrate (not shown) having semiconductor devices such as a transistor formed thereon. A first metal interconnection 101 is formed in the lower insulating layer 100 through a damascene process. An intermetallic insulating layer 102 is formed on the lower insulating layer 100 having the first metal interconnection 101 using a porous low-k material.

Then, referring to FIG. 1B, a via hole is formed in the intermetallic insulating layer 102 using a photoresist (PR) pattern (not shown) having a first opening corresponding to the first metal interconnection 101, and then the PR pattern is removed. A trench for forming a second metal interconnection is formed in the intermetallic insulating layer 102a, in which the via hole is formed, using another PR pattern (not shown) having a second opening larger than the first opening corresponding to the first metal interconnection 101.

Subsequently, referring to FIG. 1C, a barrier metal layer 103 and a conductive layer 104 are sequentially formed on the semiconductor substrate having the intermetallic insulating layer 102a in which the via hole and the trench are formed. Then, the barrier metal layer 103 and the conductive layer 104 are polished by a chemical mechanical polishing (CMP) process until the top surface of the intermetallic insulating layer 102a is exposed. Accordingly, the second metal interconnection is formed, and simultaneously a via for connecting the first and second metal interconnections is formed.

At this time, as illustrated in FIG. 2, because the intermetallic insulating layer 102a is formed of the porous low-k material having many pores, the material of the barrier metal layer 103 penetrates into the intermetallic insulating layer 102 through the pores.

Therefore, the dielectric constant of the intermetallic insulating layer 102a is increased. The increase of the dielectric constant leads to an increase of the capacitance C between the interconnections. As a result, this increases an RC delay time, and thereby reduces the operating speed and performance of the semiconductor device.

BRIEF SUMMARY

Accordingly, embodiments of, the present invention are directed to a semiconductor device and a method of manufacturing the same, capable of preventing the material of a barrier metal layer from penetrating into an intermetallic insulating layer of a porous low-k material used to reduce capacitance between interconnections, and thereby preventing an RC delay phenomenon.

In order to accomplish this object, according to one embodiment of the present invention, a semiconductor device is provided, which can include a semiconductor substrate; a lower insulating layer formed on the semiconductor substrate; a first metal interconnection formed in the lower insulating layer; an intermetallic insulating layer formed on the lower insulating layer including the first metal interconnection, and having a via hole and a trench for a second metal interconnection formed corresponding to the first metal interconnection; a carbon implantation layer formed on inner walls of the via hole and the trench of the intermetallic insulating layer; a barrier metal layer deposited on the first metal interconnection exposed through the via hole and on the carbon implantation layer; a via formed in the via hole; and the second metal interconnection formed in the trench.

According to another embodiment of the present invention, there is provided a method of manufacturing a semiconductor device, including the steps of: forming a lower insulating layer on a semiconductor substrate; forming a metal interconnection in the lower insulating layer; forming an intermetallic insulating layer on the lower insulating layer including the metal interconnection; selectively etching a portion corresponding to the metal interconnection of the intermetallic insulating layer until a surface of the metal interconnection is exposed to form a via hole; selectively etching an upper portion of the via hole of the intermetallic insulating layer to form a trench; implanting carbon into the intermetallic insulating layer having the via hole and the trench, to form a carbon implantation layer on inner walls of the via hole and the trench; depositing a barrier metal layer on a top surface of the intermetallic insulating layer including the carbon implantation layer; and forming a conductive layer on the barrier metal layer such that the via hole and the trench are filled.

DETAILED DESCRIPTION OF THE PREFERRED EMBODIMENTS

Hereinafter, a method of manufacturing a semiconductor device in accordance with preferred embodiments of the present invention will be described in detail with reference to the accompanying drawings.

FIGS. 3A through 3D are sectional views for illustrating processes of a method of forming a metal interconnection according to an embodiment of the present invention.

Figure 1A:
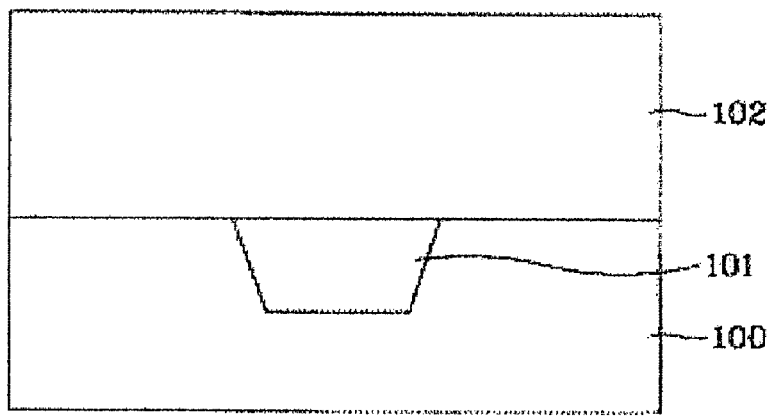
FIGS. 1A, 1B and 1C are sectional views for illustrating processes of a conventional method of forming a metal interconnection.
Figure 1B:
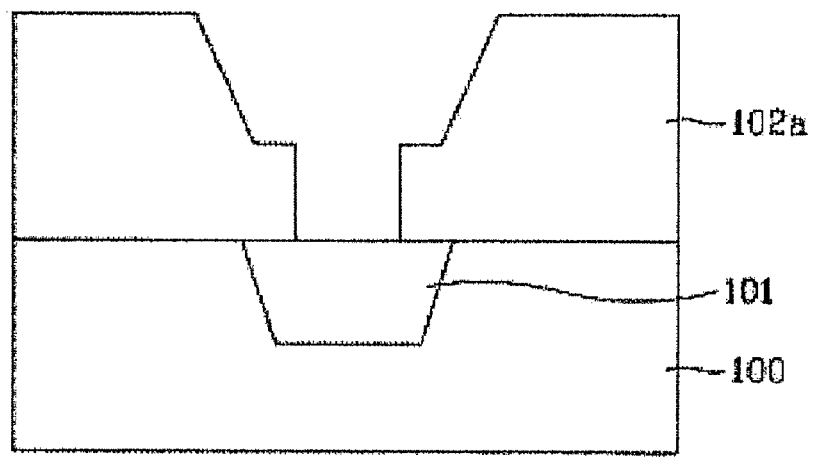
Figure 1C:
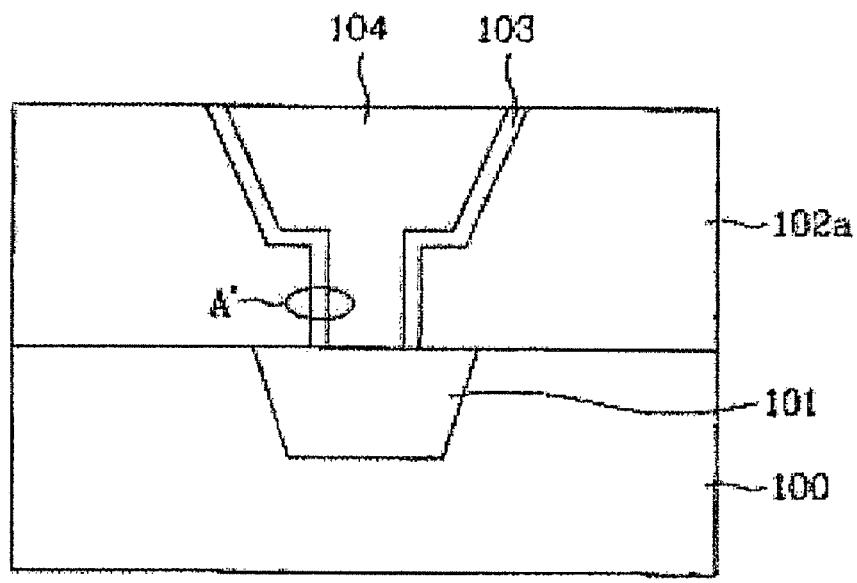
Figure 2:
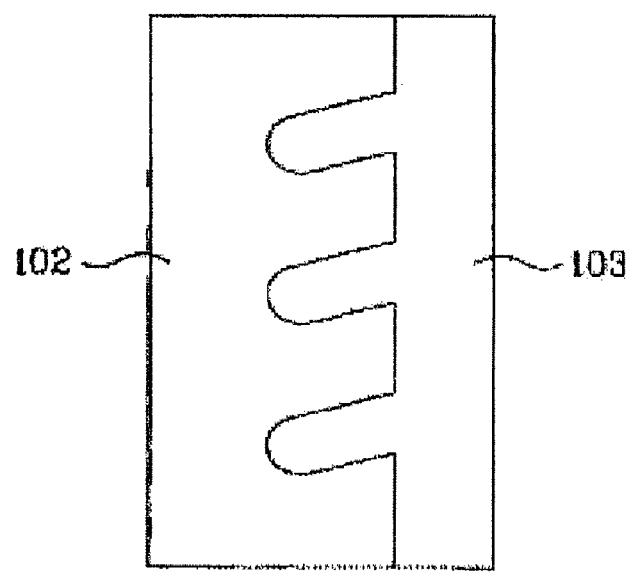
FIG. 2 is a partially enlarged view illustrating an intermetallic insulating layer and a barrier metal layer according to the related art.
Figure 3A:
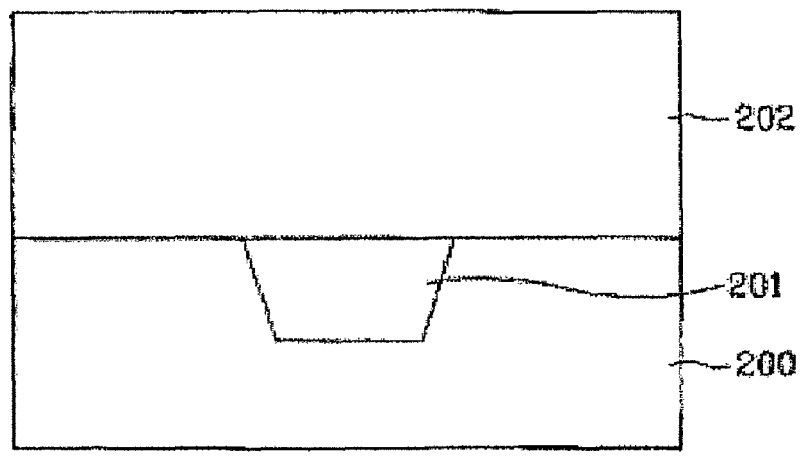
FIGS. 3A through 3D are sectional views for illustrating processes of a method of forming a metal interconnection according to an embodiment of the present invention.

First, referring to FIG. 3A, a lower insulating layer 200 can be formed on a semiconductor substrate (not shown) having semiconductor devices such as a transistor formed therein. A first metal interconnection 201 can be formed in the lower insulating layer 200 through a damascene process. In other words, part of the lower insulating layer 200 can be selectively etched using a photolithography process, to form a trench (not shown). This trench can be filled with a conductive material such as tungsten (W), aluminum (Al), or copper (Cu), thereby forming the first metal interconnection 201. Here, the damascene process can prevent a height difference, which occurs in a conventional method of forming a metal interconnection, so that it makes it possible to perform the subsequent processes easily and stably.

Referring again to FIG. 3A, an intermetallic insulating layer 202 can be formed on the lower insulating layer 200 having the first metal interconnection 201 using a porous low-k material. In an embodiment, fluorinated silicate glass (FSG) or organosilicate glass (OSG) having a lot of pores can be used.

Figure 3B:
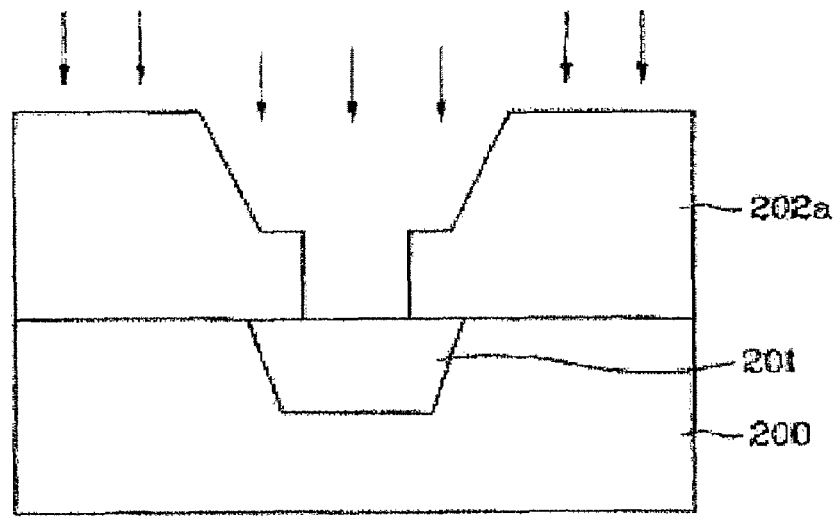

Then, referring to FIG. 3B, a via hole can be formed in the intermetallic insulating layer 202 using a first photoresist (PR) pattern (not shown) having a first opening in correspondence with the first metal interconnection 201. The first PR pattern can be removed, and a trench for forming a second metal interconnection can be formed in the intermetallic insulating layer 202a, in which the via hole is formed, using a second PR pattern (not shown) having second opening larger than the first opening in correspondence with the first metal interconnection 101.

Figure 3C:
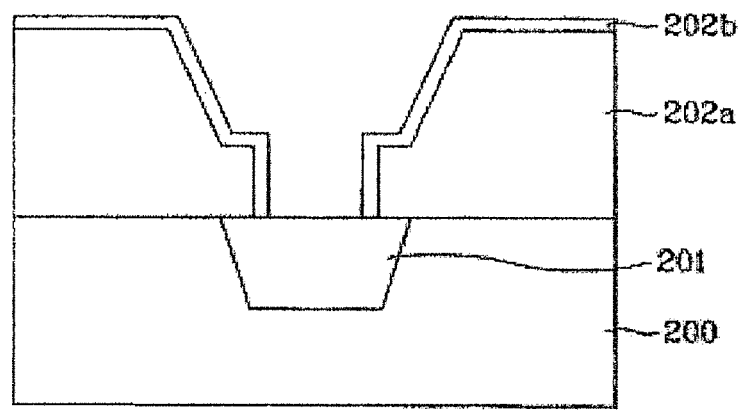

Subsequently, the intermetallic insulating layer 202a having the via hole and the trench can be subjected to carbon implantation. Referring to FIG. 3C, the carbon implantation forms a carbon implantation layer 202b on inner walls of the via hole and trench of the intermetallic insulating layer 202a. Specifically, the carbon implantation can be performed on the intermetallic insulating layer 202a, which has a plurality of pores at its surface due to its porous low-k material, to seal the pores of the surface of the intermetallic insulating layer 202a. The carbon implantation can be immediately followed by heat treatment, so that the carbon implantation layer 202b is hardened.

The hardened carbon implantation layer 202b inhibits the material of a barrier metal layer, which will be formed in the following process, from penetrating into the intermetallic insulating layer 202a. As a result, an increase of the dielectric constant of the intermetallic insulating layer 202a is prevented, so that an RC delay phenomenon can be inhibited.

Figure 3D:
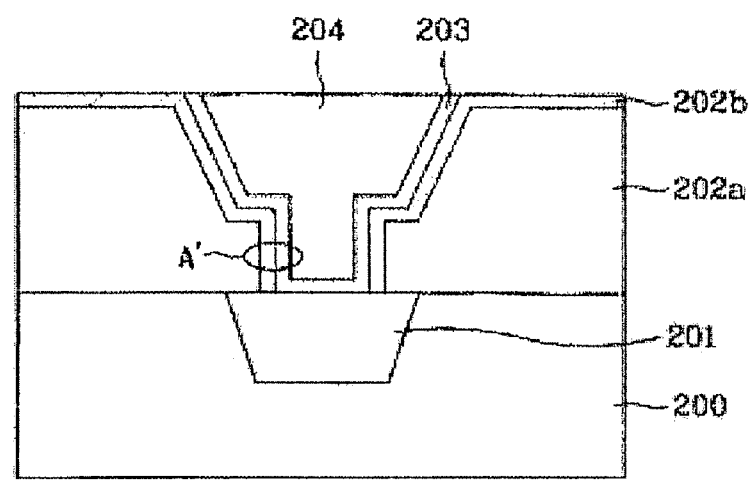

Then, referring to FIG. 3D, a barrier metal layer 203 and a conductive layer 204 can be sequentially stacked on a top surface of the semiconductor substrate having the intermetallic insulating layer 202a in which the via hole and the trench are formed, and then can be polished by a chemical mechanical polishing (CMP) process until the top surface of the intermetallic insulating layer 202a is exposed. Accordingly, the second metal interconnection is formed, and simultaneously a via for connecting the first and second metal interconnections is formed. The barrier metal layer 203 functions to prevent the material of the conductive layer 204 from penetrating into silicon, and is preferably formed of a metal based on titanium (Ti) or tantalum (Ta). The conductive layer 204 is preferably formed of copper (Cu) so as to minimize the resistance of the interconnection.

Figure 4:
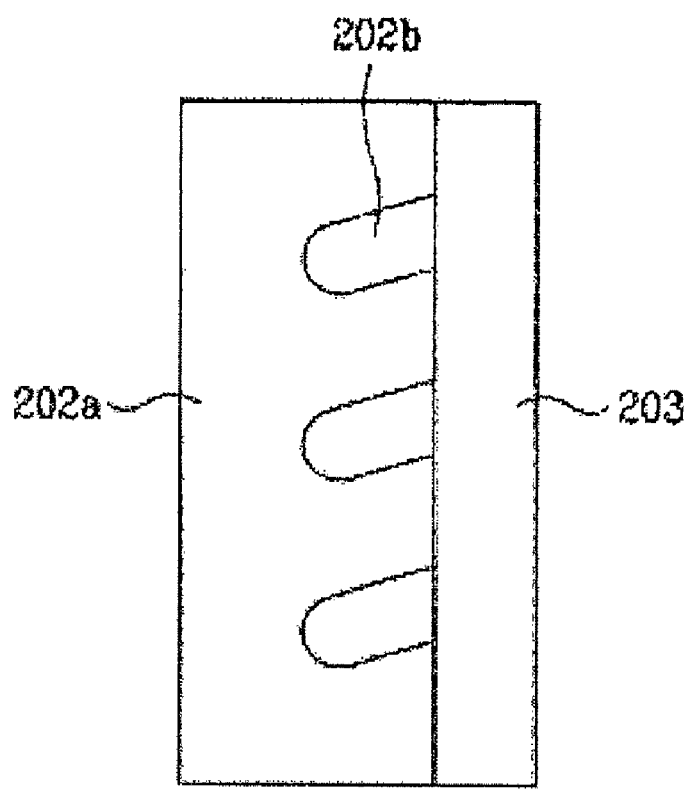
FIG. 4 is a partially enlarged view illustrating an intermetallic insulating layer and a barrier metal layer according to an embodiment of the present invention.

FIG. 4 is a partially enlarged view illustrating an intermetallic insulating layer and a barrier metal layer according to an embodiment of the present invention.

As illustrated in FIG. 4, because a lot of the pores at the surface of the intermetallic insulating layer 202a of the porous low-k material are sealed by carbon of the carbon implantation layer 202b, the material of the barrier metal layer 203 is prevented from penetrating into the intermetallic insulating layer 202a through the pores.

As described above, according to embodiments of the present invention, the pores formed on the surface of the intermetallic insulating layer of the porous low-k material can be sealed by carbon implantation, so that the material of the barrier metal layer can be prevented from penetrating into the intermetallic insulating layer through the pores. Thus, the intermetallic insulating layer can maintain a low dielectric constant inherent in the porous low-k material, and this low dielectric constant prevents the RC delay phenomenon. As a result, the reliability of the semiconductor device can be improved.

It will be apparent to those skilled in the art that various modifications and variations can be made in the present invention. Thus, it is intended that the present invention covers the modifications and variations of this invention provided they come within the scope of the appended claims and their equivalents.

We claim:

1. A method of manufacturing a semiconductor device, comprising:

forming a lower insulating layer on a semiconductor substrate;

forming a metal interconnection in the lower insulating layer;

forming an intermetallic insulating layer on the lower insulating layer including the metal interconnection;

selectively etching a portion of the intermetallic insulating layer until a surface of the metal interconnection is exposed to form a via hole;

selectively etching an upper portion of the intermetallic insulating layer to form a trench, wherein the via hole connects the trench to the metal interconnection;

implanting carbon into the intermetallic insulating layer having the via hole and the trench to form a carbon implantation layer on inner walls of the via hole and the trench;

depositing a barrier metal layer on the intermetallic insulating layer including the carbon implantation layer; and forming a conductive layer on the barrier metal layer such that the via hole and the trench are filled.

2. The method according to claim 1, further comprising hardening the carbon implantation layer by performing heat treatment process after the carbon implantation layer is formed.

3. The method according to claim 1, further comprising performing an etchback on the conductive layer and the barrier metal layer until a top surface of the intermetallic insulating layer is exposed.

4. The method according to claim 1, further comprising performing chemical mechanical polishing (CMP) on the conductive layer and the barrier metal layer until a top surface of the intermetallic insulating layer is exposed.

5. The method according to claim 1, wherein forming the metal interconnection in the lower insulating layer comprises performing a damascene process.

6. The method according to claim 1, wherein the intermetallic insulating layer comprises a porous low-k thin film.

7. The method according to claim 1, wherein the intermetallic insulating layer comprises fluorinated silicate glass (FSG) or organosilicate glass (OSG) having a lot of pores.

8. The method according to claim 1, wherein the barrier metal layer comprises a metal based on titanium (Ti) or tantalum (Ta).

9. The method according to claim 1, wherein the conductive layer is formed of copper.

* * * * *